(12) United States Patent  (10) Patent No.: US 8,791,733 B2
Tertinek et al.  (45) Date of Patent: Jul. 29, 2014

(54) NON-LINEAR-ERROR CORRECTION IN FRACTIONAL-N DIGITAL PLL FREQUENCY SYNTHESIZER

(71) Applicants: Stefan Tertinek, Linz (AT); Thomas Mayer, Linz (AT); Christian Wicpalek, Puchenau (AT)

(72) Inventors: Stefan Tertinek, Linz (AT); Thomas Mayer, Linz (AT); Christian Wicpalek, Puchenau (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/645,760

(22) Filed: Oct. 5, 2012

(65) Prior Publication Data

US 2014/0097875 A1 Apr. 10, 2014

(51) Int. Cl.
*H03L 7/06* (2006.01)

(52) U.S. Cl.
USPC ............................................ 327/156; 375/376

(58) Field of Classification Search
USPC ................................ 327/159, 156; 375/376
See application file for complete search history.

(56) References Cited

U.S. PATENT DOCUMENTS

| | | | | |
|---|---|---|---|---|
| 7,848,266 | B2 * | 12/2010 | Man et al. | 370/277 |
| 8,050,376 | B2 * | 11/2011 | Liu et al. | 375/376 |
| 8,098,104 | B2 | 1/2012 | Wicpalek et al. | |
| 8,331,520 | B2 * | 12/2012 | Ueda et al. | 375/376 |
| 8,471,611 | B2 * | 6/2013 | Sfikas et al. | 327/156 |
| 8,508,266 | B2 * | 8/2013 | Frantzeskakis et al. | 327/156 |
| 2008/0068236 | A1 * | 3/2008 | Sheba et al. | 341/118 |
| 2009/0147902 | A1 * | 6/2009 | Liu et al. | 375/376 |
| 2010/0020730 | A1 * | 1/2010 | Man et al. | 370/277 |
| 2010/0123488 | A1 * | 5/2010 | Palmer et al. | 327/115 |
| 2011/0002424 | A1 * | 1/2011 | Le Guillou | 375/344 |
| 2011/0007859 | A1 * | 1/2011 | Ueda et al. | 375/376 |
| 2011/0148490 | A1 * | 6/2011 | Lee et al. | 327/159 |
| 2013/0027102 | A1 * | 1/2013 | Chen et al. | 327/158 |
| 2013/0093524 | A1 * | 4/2013 | Nakamura | 331/34 |
| 2013/0113536 | A1 * | 5/2013 | Sfikas et al. | 327/158 |

OTHER PUBLICATIONS

Elvi Raeisaenen-Ruotsalainen; "A Low-Power CMOS Time-to-Digital Converter"; IEEE Journal of Solid-State Circuits, vol. 30, No. 9, Sep. 1995, p. 984-990.
Manuel Mota, et al.; "A High-Resolution Time Interpolator Based on a Delay Locked Loop and a RC Delay Line", IEEE Journal of Solid-State Circuits, vol. 34, No. 10, Oct. 1999, p. 1360-1366.
Hsiang-Hui Chang, et al.; A Fractional Spur-Free ADPLL with Loop-Gain Calibration and Phase-Noise Cancellation for GSM/GPRS/EDGE; ISSCC 2008/Session 10/Cellular Transceivers/ 10.1; 2008 IEEE International Solid-State Circuits Conference, p. 200-201, 600.

(Continued)

*Primary Examiner* — Ryan Jager
(74) *Attorney, Agent, or Firm* — Eschweiler & Associates, LLC

(57) ABSTRACT

The present disclosure relates to a frequency synthesizer. The frequency synthesizer includes a phase comparator having first and second input nodes. The first input node receives a reference signal having a reference frequency. A channel control block has an input that receives a channel word and an output coupled to the second input node of the phase comparator. A local oscillator (LO) output node provides an LO signal having an LO frequency based on the reference frequency and the channel word. A feedback back couples the LO output node to the second input node of the phase comparator through the channel control block. A non-linear error correction element is operably coupled on a coupling path extending between the phase comparator and the DCO.

19 Claims, 5 Drawing Sheets

(56) References Cited

OTHER PUBLICATIONS

Pin-En Su, et al.; "Mismatch Shaping Techniques to Linearize Charge Pump Errors in Fractional-N PLLs"; IEEE Transactions on Circuits and Systems—I: Regular Papers, col. 57, No. 6, Jun. 2010, p. 1221-1230.

A. Ravi, et al.; "A 9.2-12GHz, 90nm digital fractional-N synthesizer with stochastic TDC calibration and -35/-41dBc integrated phase noise in the 5/2.5GHz bands"; 2010 Symposium on VLSI Circuits/ Technical Digest of Technical Papers, p. 143-144.

A.C. Dent, et al.; "Linearization of Analog-to-Digital Converters"; IEEE Transactions on Circuits and Systems, vol. 37, No. 6, Jun. 1990, p. 729-737.

Jochen Rivoir, "Statistical Linearity Calibration of Time-To-Digital Converters Using a Free-Running Ring Oscillator", 15th Asian Test Symposium, 2006 IEEE Computer Society, p. 1-6.

Rashid Rashidzadeh, et al.; "An All-Digital Self-Calibration Method for a Vernier-Based Time-to-Digital Converter", IEEE Transactions on Instrumentation and Measurement, vol. 59, No. 2, Feb. 2010, p. 463-469.

Pedro Julian, et al.; "High-Level Canonical Piecewise Linear Representation Using a Simplicial Partition"; IEEE Transactions on Circuits and Systems—I: Fundamental Theory and Applications, vol. 46, No. 4, Apr. 1999, p. 463-480.

J.L. Figueroa, et al.; "A Simplicial Canonical Piecewise Linear Adaptive Filter"; Circuits Systems Signal Processing; vol. 23, No. 5, 2004, p. 365-386.

* cited by examiner

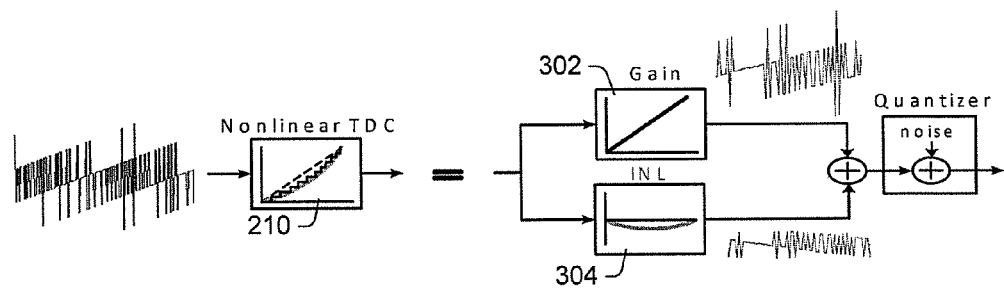
Fig. 3
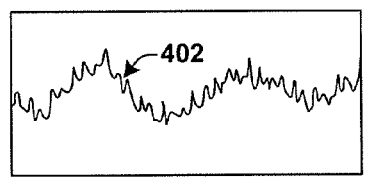 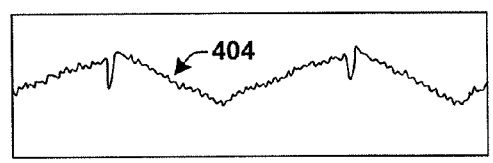
Fig. 4A            Fig. 4B

NON-LINEAR-ERROR CORRECTION IN FRACTIONAL-N DIGITAL PLL FREQUENCY SYNTHESIZER

BACKGROUND

A core building block of modern wireless transceivers is radio frequency (RF) synthesizers, which are used to synthesize channel frequencies used during wireless communication. Conventional frequency synthesizers for multi-mode and multi-band operation are based on fractional-N digital PLLs (FN DPLLs). FN DPLLs are able to synthesize output frequencies that are a fractional multiple of a fixed reference frequency REF. Unfortunately, due to non-linearities for devices within the FN DPLLs, conventional frequency synthesizers exhibit non-linear behavior over operating ranges used for wireless communication. Conventional FN DPLLs fail to account for this non-linear behavior, and therefore, their output frequencies are less precise than desired.

BRIEF DESCRIPTION OF THE DRAWINGS

FIG. 3 shows a functional block diagram illustrating how a non-linear TDC can be represented as a linear gain component and a non-linear INL component.

FIGS. 4A-4B illustrate integral non-linearity (INL) measurement results of two time-to-digital converters (TDCs).

DETAILED DESCRIPTION

Figure 1:
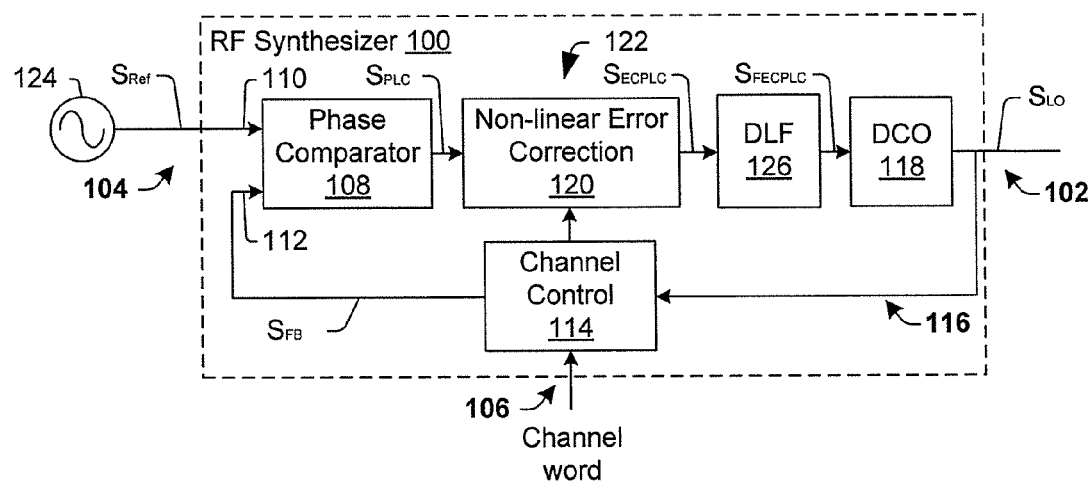
FIG. 1 illustrates a radio frequency (RF) synthesizer that includes a non-linear error correction block.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

FIG. 1 illustrates an example of a radio frequency (RF) synthesizer 100. The RF synthesizer 100 is adapted to provide a local oscillator (LO) signal, $S_{LO}$, at its output 102, wherein $S_{LO}$ is based on a reference signal, $S_{Ref}$, and a channel word provided at first and second inputs 104, 106, respectively. The LO signal, $S_{LO}$, has an LO frequency that is an integer multiple or a fractional multiple of that of the reference signal, $S_{Ref}$, wherein the integer multiple or fractional multiple is set by the channel word on second input 106. For example, if $S_{Ref}$ has a fixed reference frequency of 2 GHz and the channel word specifies a fractional multiple of 3/2, the RF synthesizer would output $S_{LO}$ at an LO frequency of 3 GHz. The channel word can be changed in time to correspond to different integer multiples and/or fractional multiples, thereby tuning the LO frequency to facilitate communication over different frequency channels in time.

To implement this functionality, the RF synthesizer 100 includes phase comparator 108 having first and second phase comparator input nodes 110, 112, respectively. The first phase comparator input node 110 is configured to receive the reference signal, $S_{Ref}$, for example from a crystal oscillator or other reference frequency source 124; and the second phase comparator input node 112 is coupled to an output of channel control block 114. The channel control block 114, which is arranged on a feedback path 116, receives the LO signal, $S_{LO}$, as generated by a digitally controlled oscillator (DCO) 118 and adjusts the LO signal based on the channel word provided on 106, thereby generating a feedback signal, $S_{FB}$. The phase comparator 108 compares the feedback signal, $S_{FB}$, with the reference signal, $S_{Ref}$, and delivers a phase lock control signal, $S_{PLC}$, based on this comparison. This phase lock control signal, $S_{PLC}$, tends to adjust the output state of the DCO 118 until the LO signal reaches a target LO frequency which is given by the reference frequency multiplied by the channel word. As the channel word is changed to represent a new frequency, the channel control block 114 changes the feedback signal correspondingly, and the phase comparator 108 updates the phase lock control signal, $S_{PLC}$, to induce a corresponding change in the DCO 118 to generate the new frequency.

Although this functionality is well understood, the inventors have appreciated that the phase comparator 108 may exhibit non-linear behavior over its operating range. Absent countermeasures, this non-linear behavior can cause the frequency of the LO signal, $S_{LO}$, to vary undesirably from that of the target LO frequency over the operating range of the device. To limit this non-linear behavior, a non-linear error correction element 120 is included on a coupling path 122 extending between the phase comparator 108 and the DCO 118. As will be appreciated in more detail below, the non-linear error correction element 120 can account for non-linear behavior of the phase comparator 108 based on the channel word and/or the phase lock control signal, $S_{PLC}$. To account for the non-linear behavior of the phase comparator 108, the non-linear error correction block 120 adjusts the phase lock control signal, $S_{PLC}$, to provide an error corrected phase lock control signal, $S_{ECPLC}$. The $S_{ECPLC}$ signal corrects for small non-linear effects of the phase comparator 108, and helps to provide extremely accurate output frequencies and a better balance of performance and power management for communication devices. A digital loop filter 126 can filter the $S_{ECPLC}$ signal to provide a filtered error corrected phase lock control signal, $S_{FECPLC}$, which is provided to the DCO 118 to retain acceptable DCO performance.

Figure 2:
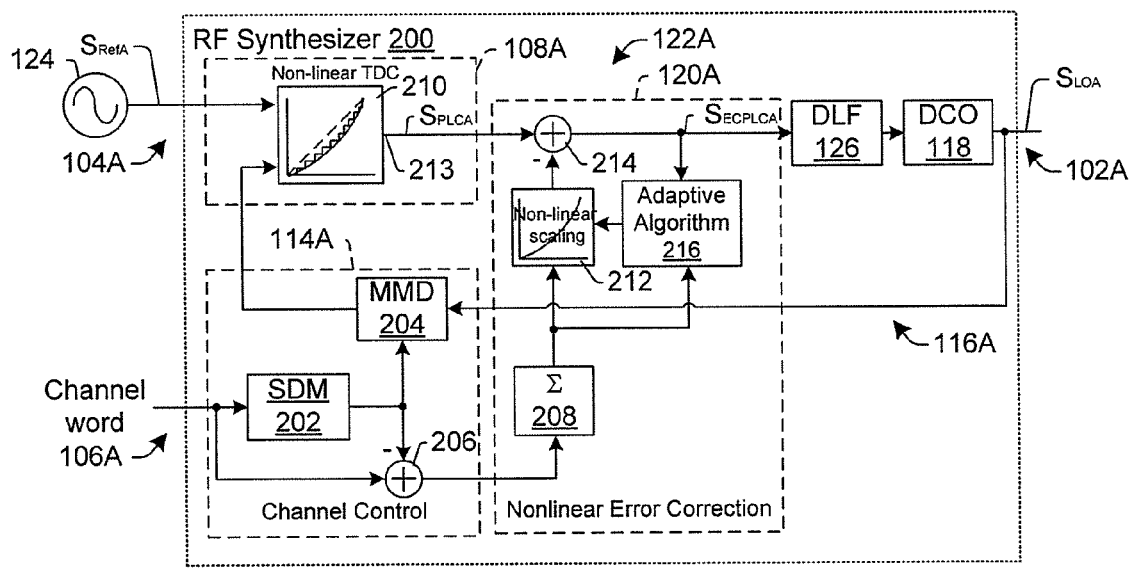
FIG. 2 illustrates a more detailed radio frequency (RF) synthesizer that includes a non-linear error correction block.

FIG. 2 shows a more detailed example of an RF synthesizer 200. As FIG. 2 shows an example consistent with FIG. 1, corresponding labels are provided (e.g., 108A in FIG. 2 represents one non-limiting example of a phase comparator 108 of FIG. 1; 114A in FIG. 2 represents one non-limiting example of a channel control block 114 of FIG. 1; and so on); however, it will be appreciated that FIG. 2 does not limit FIG. 1 in any way.

To achieve fractional multiplication, a sigma-delta modulator (SDM) 202 is used to dynamically change a division ratio of a multi-modulus divider (MMD) 204 arranged in feedback path 116A. The SDM 202 provides an integer sequence of MMD division ratios, which correspond to successive channel words provided on input 106A. A subtractor 206 determines the difference between the integer sequence of MMD division ratios and the channel words, wherein the difference represents SDM quantization noise. A summation element 208 keeps a running sum of this quantization noise. Unfortunately, this SDM quantization noise also appears as an artifact at the input of a time-to-digital converter (TDC) 210 and dominates the TDC input time variation compared to time jitter introduced by other components.

Referring briefly to FIG. 3, the non-linearity of the TDC 210 can be quantified by a linear gain function 302 and an integral non-linearity (INL) function 304. This INL function 304 essentially describes the deviation of the TDC 210 from linear behavior. Representative INL measurement results of two TDC implementations are depicted in FIG. 4A and FIG. 4B, showing a sinusoidal INL characteristic 402 and a triangular INL characteristic 404, respectively.

Referring back to FIG. 2, to prevent or limit the extent at which the SDM quantization noise (and noise components due to non-linearity of the TDC 210) appears as phase noise at the RF output 102A, the RF synthesizer includes a non-linear error correction element 120A. The non-linear error correction element 120A achieves noise cancellation by using summation element 208 to digitally generate a running sum of SDM quantization noise, scaling the sum (using non-linear scaling element 212 and adaptive algorithm 216), and then subtracting the scaled version of this sum from the TDC output 213 using subtractor 214. The error corrected phase lock control signal, $S_{ECPLCA}$, is then passed to digital loop filter 126, before progressing to the DCO 118 to generate the specified LO frequency, $S_{LOA}$.

If the shape of the INL characteristic for TDC 210 is known beforehand (e.g. through measurements or from circuit simulations), then the non-linear scaling block 212 inside the non-linear error correction element 120A can be chosen accordingly, and the adaptive algorithm 216 selects predetermined coefficients for a linear combination of predetermined basis functions that parameterize the expected non-linearity. For the sinusoidal INL of FIG. 4A, for instance, the coefficients supplied to the non-linear scaling block 212 would be chosen to represent the known sinusoidal function, with the amplitude of the sinusoid being the tuning parameter of the adaptive algorithm 216. Because the TDC INL is known beforehand in such a scenario, no calibration is required, which saves system resources for other tasks.

On the other hand, if the shape of TDC INL is not known beforehand, then the non-linearity of TDC 210 may be approximated by a linear combination of basis functions. In particular, such an approximation for a non-linear characteristic $f$ (the sum of gain and INL in FIG. 3) is given by:

$$f \approx \sum_{n=1}^{N} c_n \Psi_n \quad (1)$$

where $\Psi_n$, n=1, ..., N, are the basis functions and $c_n$, n=1, ..., N, are the coefficients which are tuned by the adaptive algorithm 216 to minimize the error corrected phase lock control signal.

Figure 5:
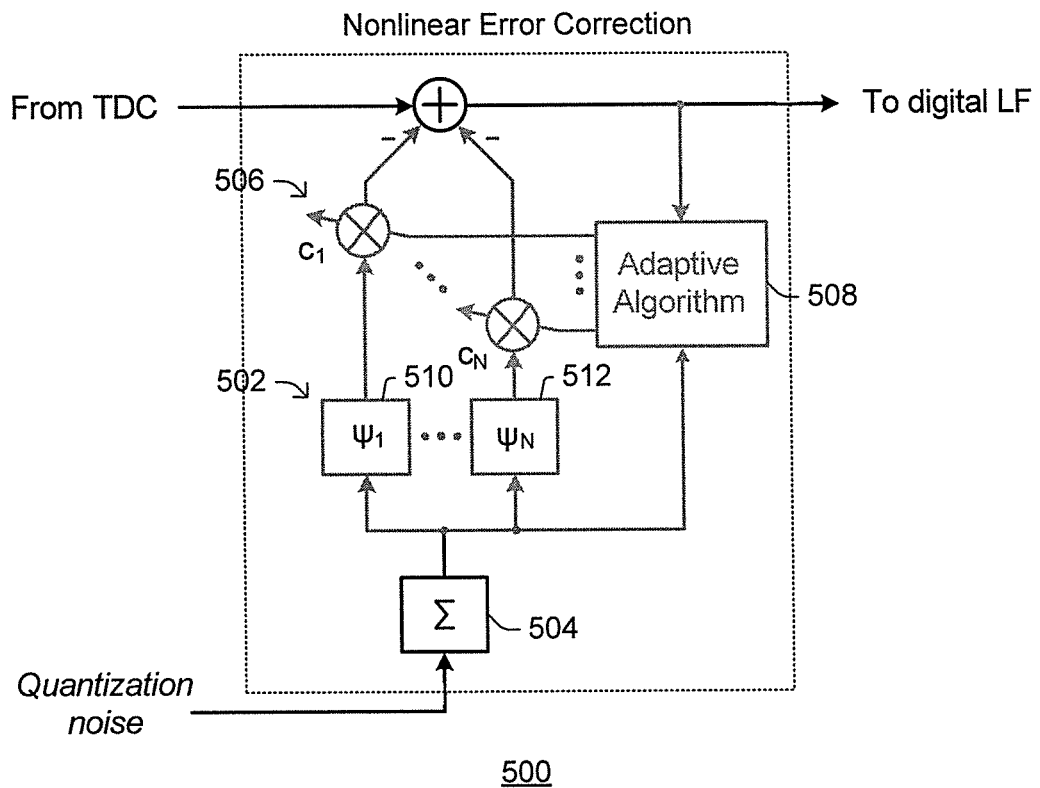
FIG. 5 illustrates a non-linear error correction block that includes a number of basis function paths.

A preferred embodiment of a non-linear error correction element 500 which makes use of such basis functions is shown in FIG. 5. It consists of N basis function paths 502 (where N is a positive integer), which have their respective inputs coupled to the output of summation element 504. During operation, the N basis functions paths 502 receive the running sum of SDM quantization noise from the summation element 504. The N basis function paths also have N multipliers 506, respectively, which receive N coefficients that are controlled by adaptive algorithm block 508. Note that by setting N=1 and $\Psi_1 \equiv 1$, a linear error correction can be obtained.

Typical basis functions include, but are not limited to, the following: (orthogonal) polynomials, splines, radial basis functions, (canonical) piecewise-linear and piecewise-orthogonal functions. For example, the first basis function $\Psi_1$ (510) can comprise a first polynomial, a second basis function $\Psi_2$ can comprise a second polynomial that is orthogonal to the first polynomial, ..., and the Nth basis function $\Psi_N$ (512) can comprise an Nth polynomial that is orthogonal to the first and second polynomials. The many basis functions enable considerable flexibility in the design and implementation of the non-linear error correction element 500, trading off increased approximation accuracy, and thus improved reduction of INL-induced distortion, with higher implementation complexity.

Figure 6:
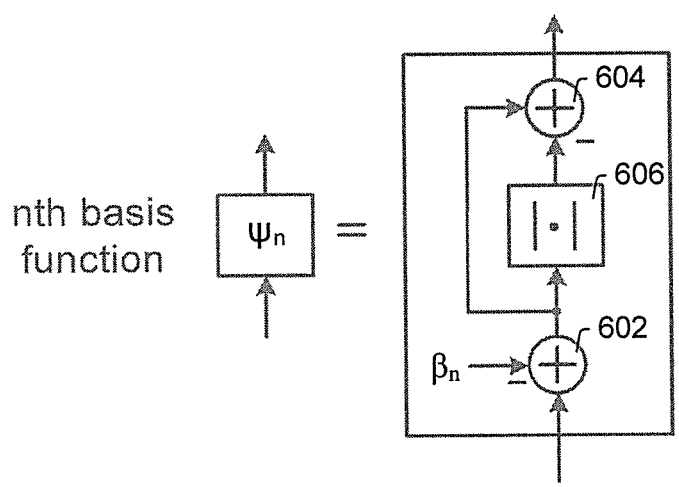
FIG. 6 illustrates a more detailed example of a basis function path.

A more detailed basis function block 600 is the simplicial canonical piece-wise linear (SCPWL) function shown in FIG. 6. This basis function block allows a sufficiently accurate, piece-wise linear approximation of a typical non-linearity while being efficient to implement, requiring only two adders 602, 604 and one absolute value function 606. Mathematically, the $n^{th}$ basis function is given by:

$$\Psi_n(x) = \begin{cases} 0.5(x - \beta_n + |x - \beta_n|), & x \leq \beta_N \\ 0.5(\beta_n - \beta_n + |\beta_n - \beta_n|), & x > \beta_N \end{cases}$$

where the parameters $\beta_1 \leq \beta_2 \leq ... \leq \beta_N$ determine the transition points that divide the input range into affine segments.

Figure 7:
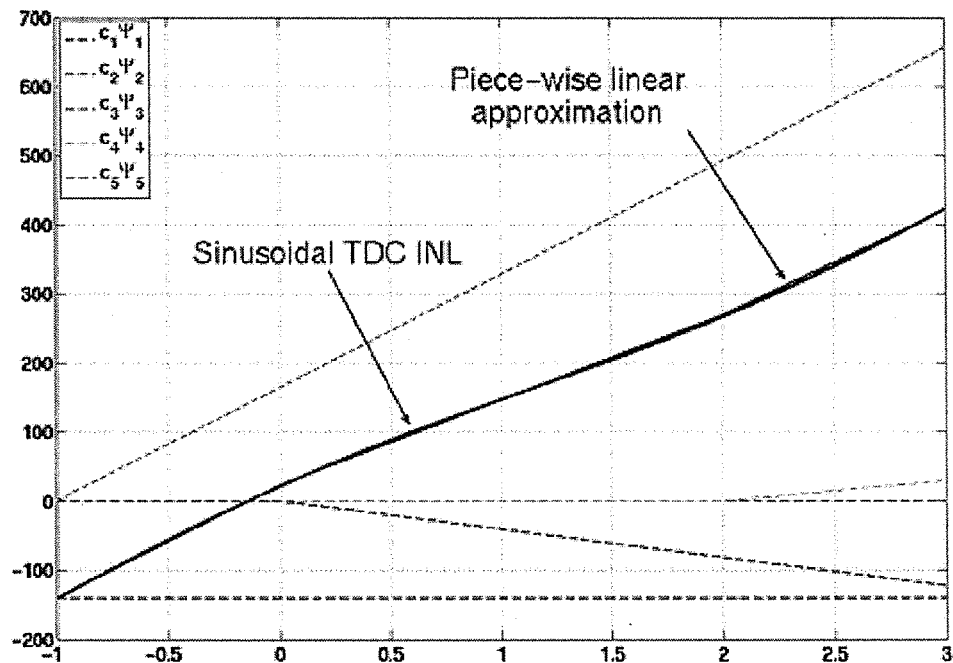
FIG. 7 plots scaled basis functions $c_1 \Psi_1, \ldots, c_5 \Psi_5$ to provide a piece-wise linear approximation of the sinusoidal non-linearity previously illustrated in FIG. 4A.

FIG. 7 plots the scaled basis functions $c_1 \Psi_1, ..., c_5 \Psi_5$, the sum of which gives a good piece-wise linear approximation of a non-linear TDC with the sinusoidal INL previously illustrated in FIG. 4A.

Figure 8:
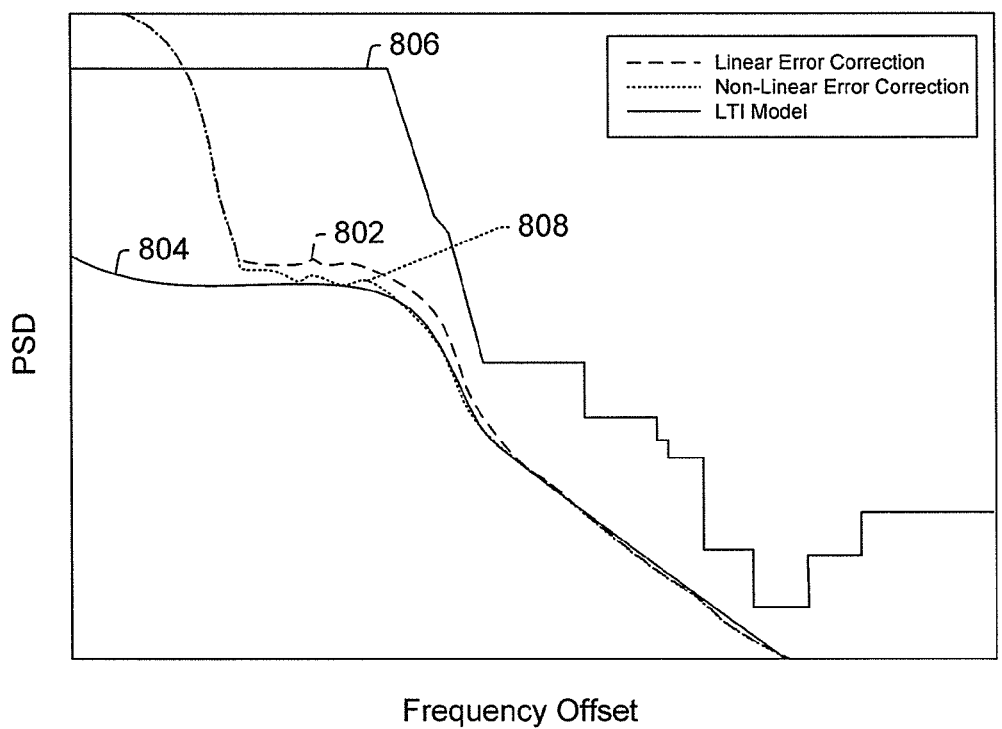
FIG. 8 shows various simulated output phase-noise spectrums of various RF synthesizers.

FIG. 8 shows various simulated output phase-noise spectrums of various RF synthesizers. A first curve 802 was simulated using a third-order multi-stage noise-shaping (MASH) SDM and a linear error correction (rather than a non-linear error correction as described herein). As shown by first curve 802, the linear error correction is unable to cancel the noise component introduced by the sinusoidal INL, leading to an increased in-band phase-noise floor compared to when a TDC with a linear characteristic is used (linear time-invariant (LTI) model—curve 804). Without further reduction of this in-band distortion, the phase-noise performance of the RF output signal may violate limits specified in cellular standards, such as the RMS phase-error limit, or spectral mask—limits 806. Therefore, a simulation was also carried out for an RF synthesizer which includes a non-linear error correction—see curve 808. The non-linear error correction curve 808 clearly demonstrates that a non-linear error correction can improve the in-band phase noise significantly, relative to conventional linear error correction implementations. Moreover, if the TDC INL varies over time, the coefficients $c_n$, n=1, ..., N, will be automatically adapted by the adaptive algorithm (typically an LMS algorithm) to minimize the error corrected phase lock control signal.

Compared to prior art techniques, the proposed technique to compensate distortion introduced by the TDC INL has several advantages. Unlike LUT-based calibration of the TDC non-linearity, no special calibration signal is required, as the non-linear error correction element 120A is switched on simultaneously with the SDM 202 and directly uses the SDM quantization noise that ought to be cancelled. Thus, no dedicated calibration slot is required, reducing the total time for the frequency synthesizer to lock. Further, the adaptive algorithm 216 can automatically track changes in the INL characteristic of the TDC 210 (e.g. due to a temperature drift of analog components). This is advantageous when the RF synthesizer is operating continuously (like in continuous-mode systems such as UMTS), where slots for re-calibration of a LUT are not available. Also, the non-linear error correction element can often be implemented with standard logic cells and is thus easily portable to new process nodes.

Figure 9:
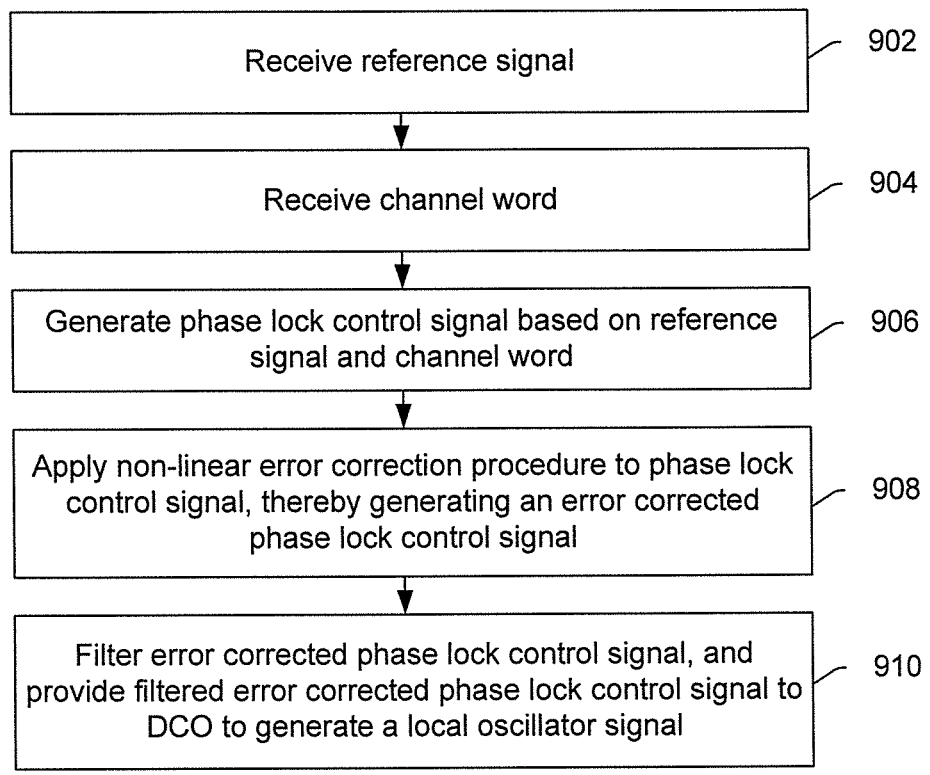
FIG. 9 illustrates a flow chart of a method for generating a radio frequency signals.

FIG. 9 is a flow diagram of some embodiments of a method 900 for synthesizing RF frequencies. While the disclosed method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 902 a reference signal is received. The reference signal has a reference frequency, which can be a fixed reference frequency such as provided by a crystal oscillator. The reference frequency can also be time-variant in other implementations.

At step 904 a channel word is received. The channel word sets an integer multiple or fractional multiple by which the reference signal is to be multiplied. For example, the fractional multiple can be in the form of N/M, wherein N and M are both positive integers. If N=5 and M=2, the channel word specifies that the reference frequency is to be multiplied by 5/2.

At 906, a phase lock control signal is generated based on the reference signal and the channel word. This phase lock control signal tends to induce phase and/or frequency changes in an LO signal provided at an output terminal of the RF synthesizer. However, the phase lock control signal can also include non-linearities over the operating range of the RF synthesizer.

To limit these non-linearities, at 908, a non-linear error correction procedure is applied to the phase lock control signal. This non-linear error correction procedure includes taking a difference between the channel word and an integer sequence of division ratios, wherein the difference represents SDM quantization noise. A running summation of SDM quantization noise is determined, and this summation is provided to a number of basis functions. These basis functions, which are supplied with respective coefficients, collectively model the non-linearity. The values of the basis functions and corresponding coefficients are then subtracted from the phase lock control signal to provide an error corrected phase lock control signal.

At 910, the error corrected phase lock control signal is provided to a digital loop filter, which generates a filtered error corrected phase lock control signal. This filtered error corrected phase lock control signal is, in turn, provided to the digitally controlled oscillator (DCO), which generates a corresponding local oscillator (LO) signal. The LO signal is locked onto the frequency and phase collectively specified by the reference frequency and channel word.

It will be appreciated that equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A frequency synthesizer, comprising:
a phase comparator having first and second input nodes, wherein the first input node is configured to receive a reference signal having a reference frequency;
a channel control block having an input node and an output node, wherein the input node is configured to receive a channel word and wherein the output node is coupled to the second input node of the phase comparator;
a local oscillator (LO) having an output node to provide an LO signal having an LO frequency based on the reference frequency and the channel word, wherein a feedback back couples the LO output node to the second input node of the phase comparator through the channel control block; and
a non-linear error correction element operably coupled on a coupling path extending between the phase comparator and the LO output node,
wherein the non-linear error correction element is configured to adjust a phase lock control signal output from the phase comparator to form an error corrected phase lock control signal for the local oscillator (LO) along the coupling path based on a non-linearly scaled detected quantization noise by the channel control block.

2. The frequency synthesizer of claim 1, wherein the non-linear error correction element is further configured to generate a running sum of quantization noise and scale the sum based on an expect or estimated non-linearity of the phase comparator, wherein the scaled sum is employed to form the error corrected phase lock control signal.

3. The frequency synthesizer of claim 2, wherein the non-linear error correction element comprises an adaptive algorithm component configured to influence the scaling of the sum based on the expected or estimated non-linearity of the phase comparator.

4. A frequency synthesizer, comprising:
a phase comparator having first and second input nodes, wherein the first input node is configured to receive a reference signal having a reference frequency;
a channel control block having an input node and an output node, wherein the input node is configured to receive a channel word and wherein the output node is coupled to the second input node of the phase comparator;
a local oscillator (LO) output node to provide an LO signal having an LO frequency based on the reference frequency and the channel word, wherein a feedback back couples the LO output node to the second input node of the phase comparator through the channel control block; and a non-linear error correction element operably coupled on a coupling path extending between the phase comparator and the LO output node, wherein the non-linear error correction element comprises:

a summation element to sum a quantization error signal, wherein the quantization error signal is based on the channel word;

a plurality of basis functions paths having respective inputs coupled to the summation element; and an adaptive algorithm element to supply a plurality of coefficients to the plurality of basis function paths, respectively.

5. The frequency synthesizer of claim 4, wherein a basis function path comprises a basis function followed by a multiplier.

6. The frequency synthesizer of claim 5, wherein the basis function comprises at least one of the following: a polynomial which is orthogonal with regards to another basis function, a spline function, a radial basis function, or a canonical piecewise-linear or piecewise-orthogonal function.

7. The frequency synthesizer of claim 4, wherein a basis function path includes:

a first subtraction element having an input and an output, wherein the input of the first subtraction element is coupled to the summation element;

an absolute value element having an input and an output, wherein the input of the absolute value element is coupled to the output of the first subtraction element; and a second subtraction element having first and second inputs and an output, wherein the first input of the second subtraction element is coupled to the output of the first subtraction element and wherein the second input of the second subtraction element is coupled to the output of the absolute value element, and wherein the output of the second subtraction element is coupled to the coupling path.

8. The frequency synthesizer of claim 4, where the adaptive algorithm is adapted to set the coefficients based on both the channel word and a phase lock control signal provided on the coupling path.

9. A frequency synthesizer, comprising:

a reference frequency input node to receive a reference signal having a reference frequency;

a channel control block to receive a channel word, wherein the channel word varies in time to correspond to a time-variant output frequency to be delivered by the frequency synthesizer;

a time-to-digital converter (TDC) adapted to provide a phase lock control signal to induce a digitally controlled oscillator (DCO) to provide an output signal exhibiting the time-variant output frequency, wherein the time-variant digital value is based on the reference signal and the channel word; and a non-linear error correction element arranged on a coupling path between the TDC and the DCO, and configured to form an error corrected phase lock control signal for the digitally controlled oscillator (DCO) along the coupling path based on a non-linearly scaled detected quantization noise by the channel control block.

10. The frequency synthesizer of claim 9, wherein the non-linear error correction element comprises:

an addition or subtraction element downstream of the TDC and adapted to receive the phase lock control signal and provide an error corrected phase lock control signal;

a digital loop filter to provide a filtered error corrected phase lock control signal to the DCO based on the error corrected phase lock control signal; and an adaptive algorithm element to selectively adjust a plurality of noise coefficients to set a value of the error corrected phase control signal.

11. The frequency synthesizer of claim 9, wherein the channel control block comprises:

a sigma delta modulator to receive the channel word and provide a sequence of integers corresponding thereto; and a subtraction element to provide a quantization noise signal based on a difference between the channel word and the sequence of integers.

12. The frequency synthesizer of claim 11, wherein frequency tuning circuit further comprises:

a multi-modulus divider (MMD) having a variable division ratio set by the sequence of integers, where the MMD is arranged on a feedback path between the DCO and TDC.

13. The frequency synthesizer of claim 11, further comprising:

a summation element to sum the quantization noise signal over time;

a plurality of basis functions paths having respective inputs coupled to the summation element; and an adaptive algorithm element to supply a plurality of coefficients to the plurality of basis function paths, respectively.

14. The frequency synthesizer of claim 13, wherein a basis function path comprises a basis function followed by a multiplier.

15. The frequency synthesizer of claim 13, wherein a basis function path includes:

a first subtraction element having an input and an output, wherein the input of the first subtraction element is coupled to the summation element;

an absolute value element having an input and an output, wherein the input of the absolute value element is coupled to the output of the first subtraction element; and a second subtraction element having first and second inputs and an output, wherein the first input of the second subtraction element is coupled to the output of the first subtraction element and wherein the second input of the second subtraction element is coupled to the output of the absolute value element, and wherein the output of the second subtraction element is coupled to the coupling path.

16. The frequency synthesizer of claim 13, wherein the adaptive algorithm element is configured to determine the plurality of coefficients based on both the phase lock control signal and the summed quantization noise signal.

17. The frequency synthesizer of claim 13, wherein a basis function comprises at least one of the following: a polynomial which is orthogonal with regards to another basis function, a spline function, a radial basis function, or a canonical piecewise-linear or piecewise-orthogonal function.

18. A method, comprising:

providing a reference signal having a reference frequency;

providing a channel word that sets an integer multiple or fraction multiple by which the reference frequency is to be multiplied;

generating a phase lock control signal using a phase comparator, based on the reference signal and the channel word to induce a phase change or frequency change in a digitally controlled oscillator;

applying a non-linear error correction procedure to the phase lock control signal, thereby generating an error corrected phase lock control signal, wherein the non-linear error correction procedure comprises:

determining a plurality of coefficients that collectively characterize a non-linearity of the phase comparator; and adjusting the phase lock control signal based on the plurality of coefficients; and providing the error corrected phase lock control signal and filtering the error corrected phase lock control signal to generate a local oscillator (LO) signal, wherein the LO signal is locked onto a frequency and phase that are collectively specified by the reference frequency and the channel word.

19. The method of claim 18, wherein the non-linear error correction procedure further includes:

applying the plurality of coefficients to a plurality of basis functions, respectively; and adjusting the phase lock control signal based on the plurality of basis functions and their respective coefficients to generate the error corrected phase lock control signal.

* * * * *